(12) United States Patent  (10) Patent No.: US 8,144,972 B2
Cho et al.                 (45) Date of Patent:     Mar. 27, 2012

(54) MANUFACTURING METHOD OF PRINTED CIRCUIT BOARD AND MANUFACTURING APPARATUS FOR THE SAME

(75) Inventors: Chung Woo Cho, Cheongju-si (KR); Seon Ha Kang, Cheongju-si (KR); Young Hwan Shin, Daejeon-si (KR); Jong Jin Lee, Daejeon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 752 days.

(21) Appl. No.: 12/232,460

(22) Filed: Sep. 17, 2008

(65) Prior Publication Data

US 2010/0021045 A1    Jan. 28, 2010

(30) Foreign Application Priority Data

Jul. 22, 2008 (KR) .................. 10-2008-0071035

(51) Int. Cl.
*G06K 9/00* (2006.01)

(52) U.S. Cl. ....................................................... 382/147
(58) Field of Classification Search .................. 382/145, 382/147, 151
See application file for complete search history.

(56) References Cited

U.S. PATENT DOCUMENTS 7,127,812 B2 * 10/2006 Hiramatsu et al. .............. 29/852

FOREIGN PATENT DOCUMENTS

| JP | 06-334346 | | 12/1994 |
| JP | 10048835 | A * | 2/1998 |
| JP | 2006080216 | A * | 3/2006 |
| KR | 10-2009-0011333 | | 2/2009 |

* cited by examiner

*Primary Examiner* — Michael A Lyons

(57) ABSTRACT

The present invention relates to a method for manufacturing a printed circuit board and an apparatus for manufacturing the same; and, more particularly, to a method for manufacturing a printed circuit board and an apparatus for manufacturing the same capable of improving the degree of matching between contact holes and pads by correcting exposure position data of an exposing process for forming the pads according to positions of the contact holes.

8 Claims, 3 Drawing Sheets

[FIG. 1]
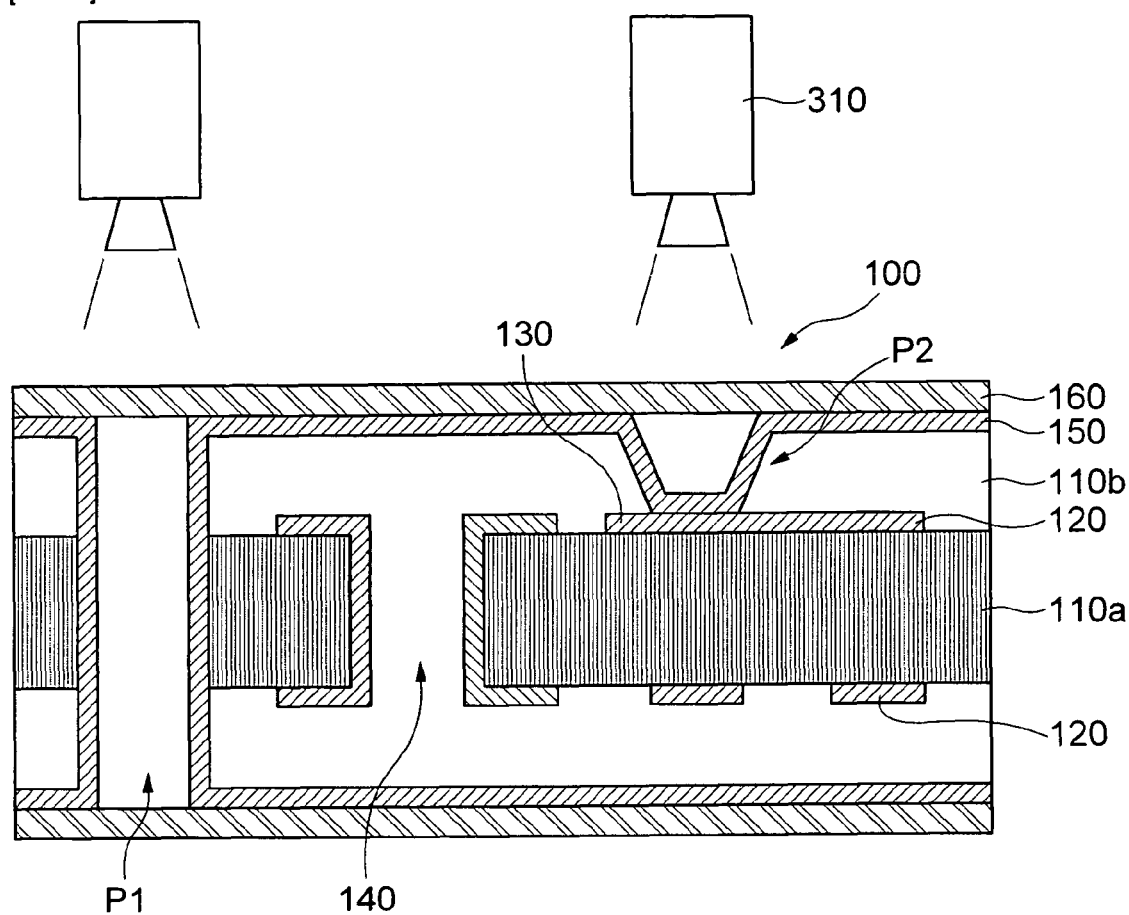

[FIG. 2]
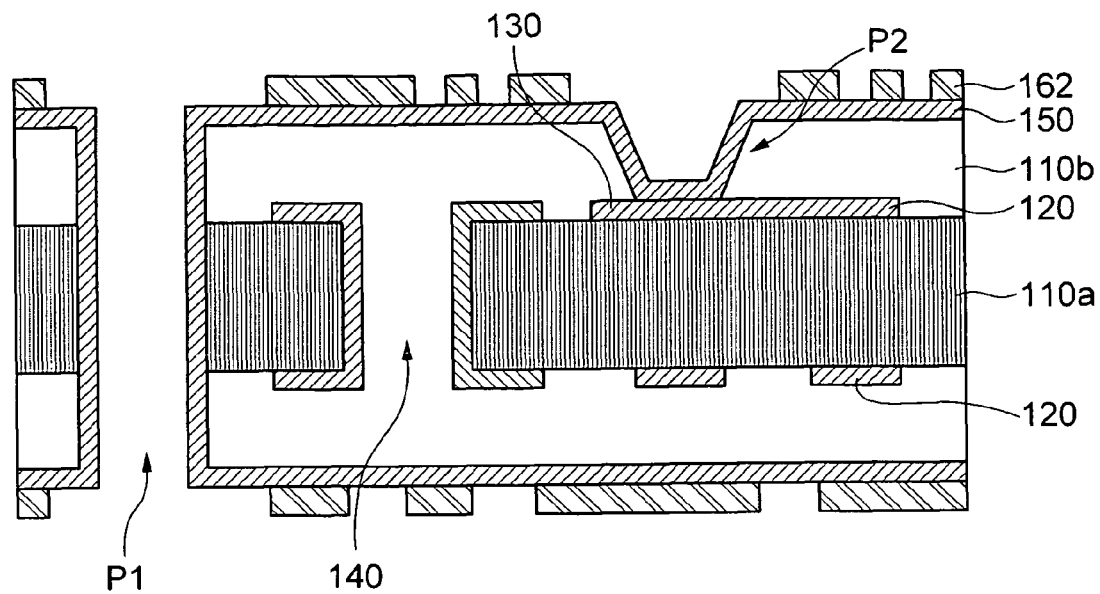
[FIG. 3]
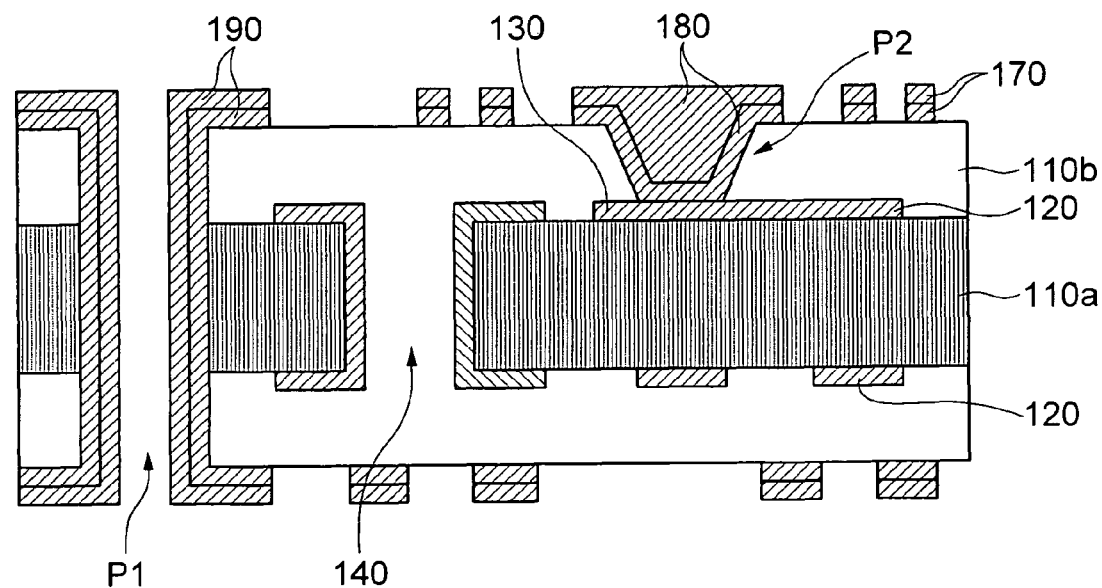

[FIG. 4]
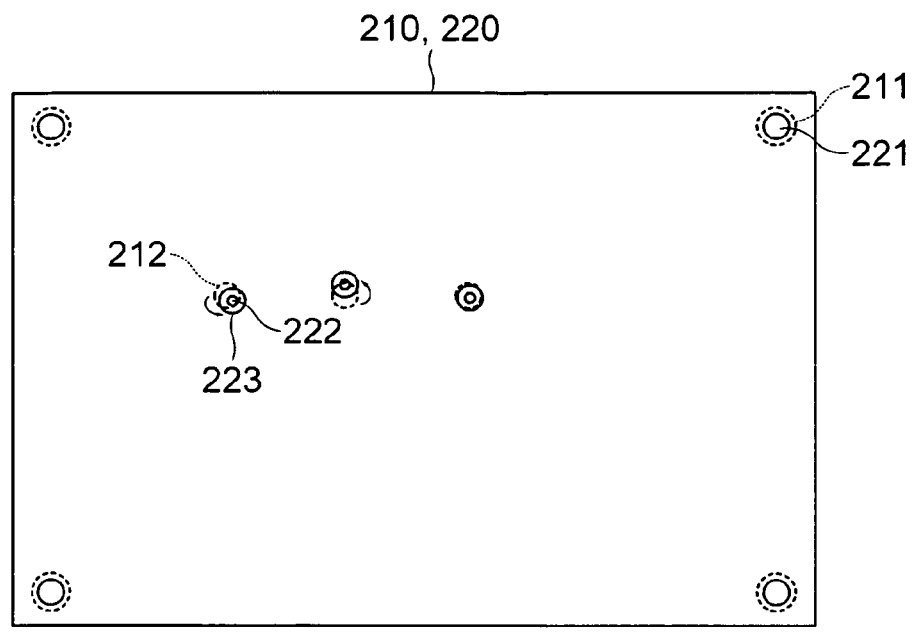
[FIG. 5]
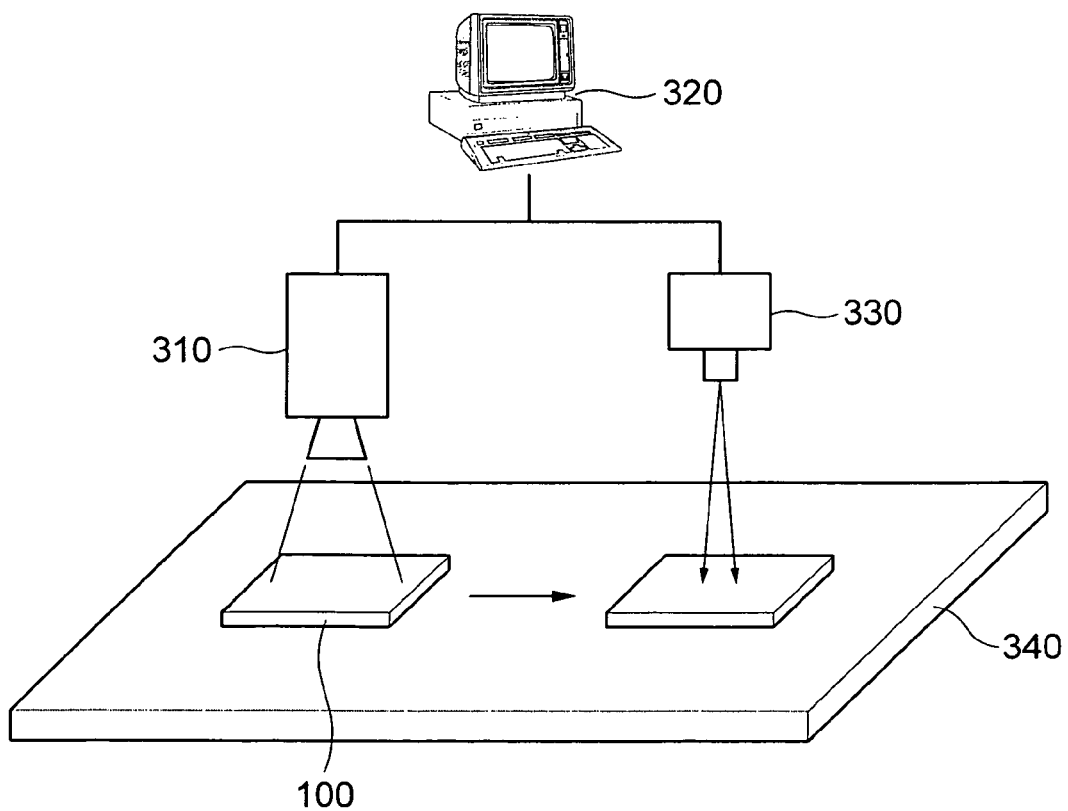

MANUFACTURING METHOD OF PRINTED CIRCUIT BOARD AND MANUFACTURING APPARATUS FOR THE SAME

CROSS-REFERENCE TO RELATED APPLICATIONS

This application claims the benefit of Korean Patent Application No. 10-2008-0071035 filed with the Korea Intellectual Property Office on Jul. 22, 2008, the disclosure of which is incorporated herein by reference.

BACKGROUND OF THE INVENTION

1. Field of the Invention

The present invention relates to a method for manufacturing a printed circuit board and an apparatus for manufacturing the same; and, more particularly, to a method for manufacturing a printed circuit board and an apparatus for manufacturing the same to correct exposure position data of an exposing process for forming a pad according to position information of a contact hole.

2. Description of the Related Art

A printed circuit board has been developed from a single layer structure to a multilayer structure with miniaturization of an electronic appliance. The multi-layered printed circuit board includes alternately arranged circuit layer and insulating layer. Herein, the circuit layer includes circuit patterns and pads electrically connected to the circuit patterns. At this time, the pads arranged on each of the insulating layers electrically connect the circuit patterns arranged on each of the insulating layers by being arranged on contact holes passing through the insulating layers.

Herein, the pad can be formed by forming a photosensitive pattern with a predetermined pattern through an exposing process and by etching a metal according to the photosensitive pattern or through a plating process.

The exposing process includes a contact exposing process and a contactless exposing process. At this time, the contact exposing process is an exposing process using a mask. Meanwhile, in the contactless exposing process, light is irradiated to a desired region through image data in design without an additional mask. Therefore, the contactless exposing process is capable of reducing a cost and simplifying a process in comparison with the contact exposing process.

However, there may be a difference between a shape of a substrate in design and that of an actual substrate due to deformation of the substrate during the process. This leads to deterioration in reliability of interlayer connection because the pad may be not formed on the desired region, that is, the contact hole when the pad is formed through the contactless exposing process.

Therefore, to improve the degree of matching in the exposing process, the process of manufacturing the printed circuit board includes steps of: forming a reference point on an edge of the printed circuit board, recognizing a position of the reference point, and then correcting image data in design according to the recognized information. However, only the information of the reference point is insufficient to entirely reflect complex and non-linear partial deformation of the substrate generated during the process of manufacturing the printed circuit board, and therefore it is difficult to completely secure the reliability of the interlayer connection.

Further, to secure the reliability of the interlayer connection, the pad was designed to maintain more than a predetermined size, but this reduces the degree of freedom in design. Consequently, there was a limit to integration and miniaturization of the printed circuit board.

SUMMARY OF THE INVENTION

It is an object of the present invention to provide a method for manufacturing a printed circuit board and an apparatus for manufacturing the same capable of improving the degree of matching in an exposing process by correcting exposure position data of the exposing process for forming a pad according to position information of a contact hole.

In accordance with one aspect of the present invention to achieve the object, there is provided a method for manufacturing a printed circuit board including the steps of: supplying a substrate having an insulating layer with a contact hole, a conductive layer positioned on the insulating layer with the contact hole and a photosensitive layer positioned on the conductive layer; generating a first position data corresponding to a position of the contact hole; generating position correction data corresponding to an error between the first position data and a second position data corresponding to a position of a pad in design; forming a photosensitive pattern by performing an exposing process and a developing process on the photosensitive layer based on the position correction data; and forming the pad according to the photosensitive pattern.

Herein, the first position data may be generated by extracting a central coordinate of the contact hole.

Further, the position correction data may be formed by moving as much as a difference between the central coordinate of the contact hole and that of the pad in design from the central coordinate of the pad in design.

Further, the step of forming the pad according to the photosensitive pattern includes the steps of: forming a plating layer on the substrate with the photosensitive pattern; delaminating the photosensitive pattern; and forming a pattern by etching the plating layer positioned under the photosensitive pattern.

Further, a circuit pattern electrically connected to the pad may be further formed in the step of forming the pad according to the photosensitive pattern.

Herein, in the step of generating the position correction data corresponding to the error between the first position data and the second position data corresponding to the position of the pad in design, a position of the circuit pattern electrically connected to the pad may be further corrected according to the position correction data.

Further, the contact hole may be a via hole or a through hole.

In accordance with the other aspect of the present invention to achieve the object, there is provided an apparatus for manufacturing a printed circuit board including an image sensor unit for generating a first position data by recognizing a position of a contact hole formed on a substrate; a control unit for generating position correction data corresponding to an error between the first position data and a second position data corresponding to a position of a pad in design.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 to FIG. 3 are cross-sectional views illustrating a method for manufacturing a printed circuit board in accordance with a first embodiment of the present invention;

FIG. 4 is a view illustrating a matching method in an exposing process in accordance with the first embodiment of the present invention; and FIG. 5 is a construction view showing an apparatus for manufacturing a printed circuit board in accordance with a second embodiment of the present invention.

DETAILED DESCRIPTION OF THE PREFERABLE EMBODIMENTS

Hereinafter, preferable embodiment for a method for manufacturing a printed circuit board and an apparatus for manufacturing the same in accordance with the present invention will be described in detail with reference to the accompanying drawings. The following embodiments are provided as examples to sufficiently transmit the spirit of the present invention to those skilled in the art. Therefore, the present invention will not be limited to the following embodiments and substitutions, modifications and changes may be made in the embodiment. And, the size and the thickness of the apparatus in the drawings may be overdrawn for more clear description and the same component is represented by the same reference numeral hereinafter.

FIG. 1 to FIG. 3 are cross-sectional views illustrating a method for manufacturing a printed circuit board in accordance with a first embodiment of the present invention. Although the printed circuit board has a cross-section of a four-layered structure in the drawings, the printed circuit board is not limited to this.

Referring to FIG. 1, to manufacture the printed circuit board, first of all, a substrate 100 is prepared. The substrate 100 may include an insulating layer 110a, a conductive layer 150, and a photosensitive layer 160.

The insulating layer 110a may be made of insulating material, for example, polyimide resin, epoxy resin, and so on. Further, an inner insulating layer 110b is provided inside the insulating layer 110a and inner circuit patterns 120 are arranged on both surfaces of the inner insulating layer 110b. However, in the embodiment of the present invention, it is not limited to a structure of the inner insulating layer 110b and the inner circuit patterns 120 provided inside the insulating layer 110a.

Contact holes P1 and P2 are formed at the insulating layer 110a. The contact holes P1 and P2 are formed in various shapes. For example, the contact holes P1 and P2 may be a through hole P1, a via hole P2, and so on. Herein, the through hole P1 passes through the inner insulating layer 110b in addition to the insulating layer 110a to electrically connect circuit patterns to be arranged on the both surfaces of the insulating layer 110a. Further, the via hole P2 exposes an inner pad 130 electrically connected to the inner circuit patterns 120 by etching the insulating layer 110a to electrically connect the circuit pattern positioned on an outer surface of the insulating layer 110a and the inner circuit patterns 120. Herein, the contact holes P1 and P2 may be formed by using a mechanical drilling method or a laser drilling method.

A conductive layer 150 is formed on the insulating layer 110a including the contact holes P1 and P2. The conductive layer 150 may be an electroless plating layer. For example, the conductive layer 150 may be made of copper.

Herein, when the contact holes P1 and P2 are the through holes P1, the conductive layer 150 electrically connects the circuit patterns arranged on both surfaces of the insulating layer 110a. Further, the contact holes P1 and P2 are the via holes P2, the conductive layer 150 is electrically connected to the inner circuit pattern 120.

A photosensitive layer 160 is formed on the conductive layer 150. The photosensitive layer 160 is characterized by being decomposed or cured by light. The photosensitive layer 160 has a film type and therefore may be formed by being attached onto the conductive layer 150. Further, the photosensitive layer 160 may be formed by coating and drying photosensitive resin. The present invention is not limited to this.

An exposing process is performed on the photosensitive layer 160 by using light with a specific wavelength range. In the exposing process, a position for irradiating the light may be controlled through data in design supplied to exposing equipment. At this time, the substrate 100 may be partially deformed due to the process for forming the substrate 100, for example, the process for forming the contact holes P1 and P2, the process for forming the plating layer 150, and the process for forming the photosensitive layer 160, and so on. At this time, when the exposing process is performed through the data in design, the degree of exposure matching is reduced, thereby deteriorating reliability of interlayer connection of the printed circuit board.

To solve the above-described problem, the data in design is corrected in consideration of the deformation of an actual substrate 100 and then the exposing process is performed through the corrected data. Specifically, before the exposing process is performed, an image of the substrate 100 including the photosensitive layer is obtained by using an image sensor 310. Herein, the image sensor 310 may be a CCD(Charge Coupled Device) camera. Herein, an optical characteristic is changed due to a thickness difference between a region with the contact holes P1 and P2 and a region without the contact holes P1 and P2 to check positions of the contact holes P1 and P2 formed on the substrate 100. At this time, the image sensor 310 can generate first position data corresponding to the positions of the contact holes P1 and P2 by extracting central coordinates of the contact holes P1 and P2 from the image.

In addition, although not shown in the drawings, a fiducial mark may be provided on an edge of the substrate 100. The image sensor 310 obtains position information of the substrate 100 by imaging the fiducial mark. Further, the fiducial mark may be used as a reference point for positions of the contact holes P1 and P2 as well as the position information of the substrate 100.

After comparing second position data corresponding to a position of a pad in design with the first position data, the second position data is corrected as much as an error between the first position data and the second position data to generate correction data. That is, the correction data may be a coordinate value obtained by moving as much as a difference between a central coordinate of the contact hole and a central coordinate of the pad in design from the central coordinate of the pad in design.

The exposing equipment forms a photosensitive pattern 162 as shown in FIG. 2 by performing the exposing process with the correction data. The photosensitive pattern 162 exposes a region where the following pad is to be formed. Further, the photosensitive pattern 162 may expose a region where a circuit pattern is to be formed in addition to the region with the pad.

In addition, before performing the exposing process, the substrate is aligned by using the fiducial mark to match a reference point of the measured substrate and a reference point of the substrate in the correction data, and then the exposing process is performed.

Therefore, it is possible to prevent deterioration of the degree of exposure matching due to the partial deformation of the substrate 100 generated in the process for forming the contact holes by forming the pad after recognizing the positions of the contact holes P1 and P2 formed on the substrate 100.

After forming an electrolytic copper plating layer on the substrate 100 including the photosensitive patterns 162 by using the photosensitive patterns 162 as plating resists, pads 180 and 190 are formed as shown in FIG. 3 by removing the photosensitive patterns and an electroless copper plating layer positioned on a lower part of the photosensitive patterns.

Further, the circuit patterns 170 in addition to the pads 180 and 190 are formed and electrically connected to the pads 180 and 190. At this time, the degree of exposure matching of the circuit patterns 170 can be improved by correcting positions of the circuit patterns 170 based on the position correction data.

In accordance with the embodiment of the present invention, although it is described that the pad is formed through a semi-additional process and so on, the process for forming the pad is not limited to this. For example, the pad may be formed through an addition process, a subtraction process, and so on. Herein, in the subtraction process, after forming the conductive layer, the circuit patterns are formed by etching the conductive layer. Further, in the addition process, the circuit patterns are formed on the insulating layer by an electroless plating method.

A numeral, 140, which is not described although shown in the drawing, may be an inner through hole passing through the inner insulating layer 110b to electrically connect the inner circuit patterns 120 arranged on both surfaces of the inner insulating layer 110b.

FIG. 4 is a view illustrating a matching method in the exposing process in accordance with the first embodiment of the present invention. Herein, an actual substrate and a substrate in design are overlapped in FIG. 4.

Referring to FIG. 4, exposing equipment forms a photosensitive pattern with a predetermined shape through direct imaging on a photosensitive layer by using data in design to irradiate light to a predetermined region without an additional mask.

Herein, design pad patterns 212 are designed on a substrate 210 in design. At this time, position information of the design pad patterns 212 is corrected by moving centers of the design pad patterns as much as errors of centers of contact holes 222 on a actually manufactured substrate 220 from the centers of the design pad patterns 212. Therefore, because the corrected design pad patterns 223 are corrected after recognizing partial deformation of the substrate, it is possible to prevent deterioration of the degree of matching of the contact holes 222 and pads due to partial deformation of the actual substrate 220.

One of numerals, 211, which are not described although shown in the drawing, represents a design fiducial mark 211 in design and the other numeral, 221 represents a fiducial mark 221 formed on the actual substrate. At this time, before performing the exposing process, the actual substrate 220 is aligned to match the fiducial mark 221 and the design fiducial mark 211.

Therefore, in accordance with the embodiment of the present invention, it is possible to improve the degree of exposure matching although the partial deformation of the substrate is generated by performing the exposing process after correcting the position information in design based on the position information of the formed contact holes 222, thereby improving the degree of freedom in design of the substrate to enhance integration and miniaturization of the printed circuit board. Further, it is possible to secure reliability of interlayer connection of the printed circuit board.

FIG. 5 is a construction view showing an apparatus for manufacturing a printed circuit board in accordance with a second embodiment of the present invention.

Referring to FIG. 5, in accordance with the embodiment of the present invention, an apparatus for manufacturing a printed circuit board includes an image sensor 310, a control unit 320, and an exposing unit 330.

The image sensor 310 may be a CCD camera. The image sensor 310 generates the first position data by recognizing an image of the substrate 100, particularly for the positions of the contact holes formed on the substrate 100.

The control unit 320 receives the first position data from the image sensor 310, compares the first position data with second position data of the contact holes in design inputted in the control unit and then generates position correction data by correcting the second position data.

The exposing unit 330 selectively performs an exposing process on the substrate 100 by the position correction data. Herein, the exposing unit 330 may include a light source for generating light with a specific wavelength range, for example, 117 nm to 11 μM and a galvanometer for changing a path of the light generated from the light source. At this time, the light can be selectively irradiated to a predetermined region by controlling the galvanometer.

Further, the apparatus for manufacturing the printed circuit board may further include a stage 340 transferring the substrate from the image sensor 310 to the exposing unit 330.

As described above, the present invention can improve the degree of matching in the exposing process by entirely reflecting the partial deformation of the substrate through correction of the position information of the pad in design according to the position information of the contact holes formed on the actual substrate.

Further, the present invention can implement the circuit integration and the miniaturization of the printed circuit board by improving the degree of matching in the exposing process.

Further, the present invention can enhance the reliability of interlayer connection of the printed circuit board by improving the degree of matching in the exposing process.

As described above, although the preferable embodiments of the present invention have been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. A method for manufacturing a printed circuit board comprising:

supplying a substrate including an insulating layer with a contact hole, a conductive layer positioned on the insulating layer with the contact hole and a photosensitive layer positioned on the conductive layer;

generating a first position data corresponding to a position of the contact hole, based on coordinates of fiducial marks positioned near edge areas of the substrate and coordinates of the contact hole;

generating a position correction data corresponding to an error between the first position data and a second position data corresponding to the position of a pad in design; and adjusting an exposing area according to the position correction data when forming the pad according to a photosensitive pattern.

2. The method according to claim 1, wherein the first position data is generated by extracting a central coordinate of the contact hole.

3. The method according to claim 2, wherein the position correction data is generated by moving at a central coordinate of the pad in design as much as a difference between the central coordinate of the contact hole and the central coordinate of the pad in design.

4. The method according to claim 1, wherein forming the pad according to the photosensitive pattern includes:
    forming a plating layer on the substrate with the photosensitive pattern;
    delaminating the photosensitive pattern; and
    forming the pad by etching the plating layer positioned under the photosensitive pattern.

5. The method according to claim 1, in forming the pad according to the photosensitive pattern,
    further forming a circuit pattern electrically connected to the pad.

6. The method according to claim 5, in generating the position correction data corresponding to the error between the first position data and the second position data corresponding to the position of the pad in design,
    further correcting a position of the circuit pattern electrically connected to the pad according to the position correction data.

7. The method according to claim 1, wherein the contact hole is a via hole or a through hole.

8. An apparatus for manufacturing a printed circuit board comprising:
    an image sensor unit to generate a first position data corresponding to a position of a contact hole, by recognizing a position of the contact hole formed on a substrate and positions of fiducial marks formed near edge areas of the substrate;
    a control unit to generate position correction data corresponding to an error between the first position data and a second position data corresponding to a position of a pad in design; and
    an exposing unit to perform an exposing process with a light-exposure area adjusted according to the position correction data.

* * * * *